United States Patent
Deschildre et al.

(10) Patent No.: US 9,952,262 B2
(45) Date of Patent: Apr. 24, 2018

(54) METHOD FOR MEASURING A PHYSICAL PARAMETER AND ELECTRONIC CIRCUIT FOR IMPLEMENTING THE SAME

(71) Applicant: EM MICROELECTRONIC-MARIN SA, Marin (CH)

(72) Inventors: Alexandre Deschildre, Marin (CH); Sylvain Grosjean, Les Fins (FR)

(73) Assignee: EM MICROELECTRONIC MARIN S.A., Marin (CH)

( * ) Notice: Subject to any disclaimer, the term of this patent is extended or adjusted under 35 U.S.C. 154(b) by 183 days.

(21) Appl. No.: 14/721,129

(22) Filed: May 26, 2015

(65) Prior Publication Data

US 2016/0003880 A1 Jan. 7, 2016

(30) Foreign Application Priority Data

Jul. 7, 2014 (EP) ..................................... 14175967

(51) Int. Cl.
| | | |
|---|---|---|
| *G01R 21/08* | (2006.01) | |
| *G01R 27/02* | (2006.01) | |
| *G01P 15/12* | (2006.01) | |
| *G01P 15/18* | (2013.01) | |
| *G01C 19/5776* | (2012.01) | |
| *G01L 1/22* | (2006.01) | |
| *G01D 5/16* | (2006.01) | |

(52) U.S. Cl.
CPC ......... *G01R 27/02* (2013.01); *G01C 19/5776* (2013.01); *G01D 5/16* (2013.01); *G01L 1/22* (2013.01); *G01P 15/12* (2013.01); *G01P 15/18* (2013.01)

(58) Field of Classification Search
None
See application file for complete search history.

(56) References Cited

U.S. PATENT DOCUMENTS 5,163,325 A * 11/1992 White ................. G01P 15/0802
73/514.24
5,726,480 A 3/1998 Pister
(Continued)

OTHER PUBLICATIONS

European Search Report of EP 14 17 5967, dated Oct. 23, 2014.

*Primary Examiner* — Jermele M Hollington
*Assistant Examiner* — Demetrius Pretlow
(74) *Attorney, Agent, or Firm* — Sughrue Mion, PLLC

(57) ABSTRACT

The physical parameter measurement method is performed using an electronic circuit (1) with a resistive sensor (2). The resistive sensor includes two resistors (R1, R2) mounted in series, whose connection node connected to a moving mass (M), is connected to a first input of an amplifier-comparator (3). A second input of the amplifier-comparator receives a reference voltage. One output of the amplifier-comparator is connected to a logic unit (4), which provides a digital output signal (OUT). A digital-to-analogue converter (5) provides a measurement voltage ($V_{dac}$), as a function of a digital signal provided by the logic unit, to the first resistor (R1) in a first phase of a measurement cycle, whereas the second resistor (R2) is polarized by a polarization voltage, and to the second resistor in a second phase, whereas the first resistor is polarized by a polarization voltage via a switching unit.

11 Claims, 1 Drawing Sheet

(56) References Cited

U.S. PATENT DOCUMENTS

| | | | | |
|---|---|---|---|---|
| 6,386,032 | B1* | 5/2002 | Lemkin | G01P 15/125 |
| | | | | 73/504.02 |
| 9,682,856 | B2* | 6/2017 | Whitesides | B81B 7/02 |
| 2005/0160814 | A1* | 7/2005 | Vaganov | G01P 15/123 |
| | | | | 73/514.01 |
| 2009/0066392 | A1* | 3/2009 | Grosjean | G01C 19/00 |
| | | | | 327/306 |
| 2013/0088247 | A1 | 4/2013 | Tseng et al. | |
| 2014/0076696 | A1* | 3/2014 | Currano | H01H 35/141 |
| | | | | 200/61.45 R |

\* cited by examiner

METHOD FOR MEASURING A PHYSICAL PARAMETER AND ELECTRONIC CIRCUIT FOR IMPLEMENTING THE SAME

This application claims priority from European Patent Application No. EP14175967.0 filed Jul. 7, 2014, the entire disclosure of which is hereby incorporated herein by reference.

FIELD OF THE INVENTION

The invention concerns a method for measuring a physical parameter, such as an acceleration or an angular velocity or a pressure or a force.

The invention also concerns an electronic circuit for implementation of this physical parameter measurement method.

BACKGROUND OF THE INVENTION

Conventionally, for measurement of a physical parameter, such as an acceleration or an angular velocity, the electronic circuit includes a capacitive sensor connected to an electronic interface capable of outputting at least one measurement signal. The capacitive sensor is formed of two differential mounted capacitors whose common electrode is movable and forms part of an armature elastically retained between the two fixed electrodes.

With this differential capacitive sensor, it is possible to make a measurement along one direction of motion of the moving electrode. At rest, the common moving electrode is equidistant from the two fixed electrodes in order to have two capacitors with an equal capacitance value. The common moving electrode can move some distance in the direction of one or other of the fixed electrodes under the action of a force. Thus the capacitance value of each capacitor varies inversely. The electronic circuit therefore generally makes it possible to output an analogue signal. This analogue output signal takes the form of a voltage dependent on the capacitance variation of the two capacitors.

The capacitive sensor may be a uniaxial accelerometer with two differential capacitors for making an acceleration measurement together with the electronic interface. However, it is also possible to provide three pairs of differential capacitors for such a capacitive sensor, such as a triaxial MEMS accelerometer for making a measurement in three directions X, Y and Z. A triaxial MEMS accelerometer of this type may include a single mass, i.e. an inertial mass common to the three pairs of differential capacitors, or three masses for the three pairs of capacitors.

The electronic interface and the capacitive sensor are generally each made in a semiconductor substrate. Thus, stray capacitances are added to the capacitances of the capacitors of the MEMS capacitive sensor, which creates non-linearities and also reduces the sensitivity or gain of the electronic circuit. The stray capacitances of the MEMS capacitive sensor together with those of the electronic interface result in a variation in the measured actual force, which is a drawback.

EP Patent Application No. 2 343 507 A1 discloses an electronic circuit with a uniaxial or triaxial measuring sensor. The measuring signals are digitally processed after a charge transfer amplifier in a logic unit. Following positive polarization and negative polarization of the capacitive sensor, digital measurement signals are stored in corresponding registers of the logic unit. A digital-to-analogue converter is also used to successively convert the digital signals for each axis in a measurement cycle into a voltage to be applied to the sensor electrodes via a switching unit. Combining the digital measurement signals after positive and negative polarization makes it possible to reduce the effect of the stray capacitances.

To obtain final acceleration measurement values for each axis, a dichotomy algorithm is used in the logic unit for a certain number of measurement cycles, prior to finishing with oversampling steps. With this dichotomy algorithm, the measurement always starts, during each conversion, at half the measurement voltage range. If an error occurs during the first measurement with a large change step in the logic unit, the final value at the end of all the measurement cycles will inevitably be erroneous, which constitutes a drawback.

Further, with an electronic circuit having a capacitive sensor, for each measurement cycle, an electrode polarization phase must always be performed, followed by a phase of discharging the capacitor electrodes by the converter measurement voltage. Consequently, with positive polarization and negative polarization, four phases must be provided per measurement cycle. This slows down the supply of digital measurement signals at the end of each conversion, which constitutes another drawback.

US patent application No. 2013/0088247 A1 may be mentioned, which discloses a measurement device with an array of variable resistance pressure sensors. The measurement device includes a switching circuit connected to the pressure sensors, a measurement circuit and a control unit for controlling the switching to selection of a target sensor of the array. Measurement is relatively complicated with this measurement device and does not concern an acceleration measurement.

U.S. Pat. No. 5,726,480 discloses the production of an accelerometer, which uses small masses connected to piezoresistors for the measurement. A silicon substrate is machined to form three-dimensional structures of the accelerometer with the piezoresistors on support arms. The piezoresistors are electrically connected in a Wheatstone bridge configuration for the acceleration measurement. However, no information is mentioned as to how to perform a measurement with the accelerometer.

SUMMARY OF THE INVENTION

It is thus an object of the invention to overcome the aforementioned drawbacks of the prior art by providing a method for measuring a physical parameter by means of an electronic circuit, which can rapidly provide at least one digital measurement signal while removing the effects of stray capacitances.

The invention therefore concerns a method for measuring a physical parameter by means of an electronic resistive sensor circuit, which includes a resistive divider with at least two resistors mounted in series, wherein a connection node of the two resistors is connected to a moving mass, which is elastically retained in a fixed structure of the sensor, and to a first input of an amplifier-comparator, a second input of the amplifier-comparator receiving a reference voltage, one output of the amplifier-comparator being connected to a logic unit for digital processing of the information provided by the amplifier-comparator and for providing at least one digital output signal, and a digital-to-analogue converter capable of providing a measurement voltage to a free end of the first resistor or to a free end of the second resistor via a switching unit, the measurement voltage being defined on the basis of a conversion of a binary word of the logic unit, which defines at least one measurement signal, wherein the measurement method includes several successive measurement cycles for one measurement conversion, wherein each successive measurement cycle comprises the steps of:

a) polarizing, via the switching unit, the free end of the second resistor by a polarization voltage and the free end of the first resistor by a measurement voltage provided by the digital-to-analogue converter based on a first digital measurement signal from a preceding cycle or from an initial binary word provided by the logic unit, the first digital signal depending on a first polarization of the resistive sensor, b) polarizing, via the switching unit, the free end of the first resistor by a polarization voltage and the free end of the second resistor by a measurement voltage provided by the digital-to-analogue converter based on a second digital measurement signal from a preceding cycle or from an initial binary word provided by the logic unit, the second digital signal depending on a second polarization of the resistive sensor.

The invention therefore concerns a method for measuring a physical parameter by means of an electronic resistive sensor circuit, which includes a resistive divider with at least two resistors mounted in series, wherein a connection node of the two resistors is connected to a moving mass, which is elastically retained in a fixed structure of the sensor, and to a first input of an amplifier-comparator, one output of the amplifier-comparator being connected to a logic unit for digital processing of the information provided by the amplifier-comparator and for providing at least one digital output signal, and a digital-to-analogue converter connected to the logic unit to provide a measurement voltage to a second input of the amplifier-comparator, the measurement voltage being defined on the basis of a binary word of the logic unit, which defines a digital measurement signal of a preceding measurement cycle or an initial binary word, wherein the measurement method includes several successive measurement cycles for one measurement conversion, wherein each successive measurement cycle comprises the steps of:

a) polarizing, via a switching unit, a free end of the second resistor by a polarization voltage and a free end of the first resistor by a low voltage to define a first polarization of the resistive sensor and to provide a first digital measurement signal in the logic unit, b) polarizing, via the switching unit, the free end of the first resistor by a polarization voltage and the free end of the second resistor by a low voltage to define a second polarization of the resistive sensor and to provide a second digital measurement signal in the logic unit.

Particular steps of the measurement method are defined in the dependent claims 3 to 7.

One advantage of the measurement method lies in the fact that just two phases per measurement cycle are sufficient to perform the physical parameter measurement. In a first phase, a positive polarization may be performed on the resistive sensor, and in a second successive phase a negative polarization can be performed on said resistive sensor. A certain number of measurement cycles with successive positive polarization and negative polarization phases is provided for one measurement conversion, in order to provide at least one digital output signal at the end of the conversion by the logic unit.

Advantageously, the voltages applied across the resistive MEMS sensor for the positive polarization and the negative polarization are well controlled. This voltage control is accomplished via a digital-to-analogue converter operating at full scale and connected to the logic unit and to a programmable gain reference voltage generator. Owing to this voltage control, it is possible to limit the current flowing through each resistor.

Advantageously, performing successive measurement cycles with positive and negative polarizations on the resistive sensor makes it possible to remove the offsets related to the MEMS sensor and to the electronic interface connected to the sensor, and the low frequency noise.

A ratiometric interface may also advantageously be provided to obtain a good DC voltage supply rejection ratio and at a low frequency.

Advantageously for the measurement method, there is great flexibility of operation of the algorithm implemented in the logic unit. This type of smart algorithm makes it possible to have a large oversampling ratio, as a result of small adaptation steps of each digital measurement signal for the converter, and high responsiveness, as a result of large adaptation steps of each digital measurement signal for the converter.

To achieve this, the measurement method advantageously uses a self-adaptive algorithm to detect large changes in the physical parameter, particularly between two successive conversions or within the same conversion. After a certain number of measurement cycles in small steps, a decision counter determines whether a continual increase or a continual decrease occurs in the digital signals, in order to adapt the size of each step of the subsequent measurement cycles. Adaptation of each step to a large digital value occurs as soon as a predetermined counting threshold of a decision counter is exceeded. As soon as the decision counter determines a change of sign in the measurement cycles with a large step value, the step size of each measurement cycle is re-adapted to small steps to reduce noise.

Advantageously for the measurement method, the last digital signal stored in each corresponding register, at the end of each conversion, allows a subsequent measurement conversion to start. To start a new conversion, it is also possible to use the last mean of the successive digital signals stored in a corresponding register in at least a final part of successive measurement cycles in small adaptation steps. Selection of the last stored digital value of each digital signal or of the mean of the digital signals in the final part of the measurement cycles can be made on the basis of a count by the decision counter.

The invention therefore also concerns an electronic circuit with a resistive sensor for implementation of the measurement method, the resistive sensor including a resistive divider with at least a first resistor and a second resistor mounted in series, wherein a connection node of the two resistors is connected to a moving mass, which is elastically retained in a fixed structure of the sensor, and to a first input of an amplifier-comparator, a second input of the amplifier-comparator receiving a reference voltage, wherein one output of the amplifier-comparator is connected to a logic unit for digital processing of the information provided by the amplifier-comparator and for providing at least one digital output signal, and wherein the electronic circuit further includes a digital-to-analogue converter capable of providing a measurement voltage to a free end of the first resistor, whereas a free end of the second resistor is polarized by a polarization voltage, or of providing the measurement voltage to the free end of the second resistor, whereas the free end of the first resistor is polarized by the polarization voltage, via a switching unit, the measurement voltage being defined on the basis of a conversion of a binary word of the logic unit, which defines at least one measurement signal.

The invention therefore also concerns an electronic circuit with a resistive sensor for implementation of the measurement method, the resistive sensor including a resistive divider with at least a first resistor and a second resistor mounted in series, wherein a connection node of the two resistors is connected to a moving mass, which is elastically retained in a fixed structure of the sensor, and to a first input of an amplifier-comparator, wherein one output of the amplifier-comparator is connected to a logic unit for digital processing of the information provided by the amplifier-comparator and for providing at least one digital output signal, wherein the electronic circuit further includes a digital-to-analogue converter connected to the logic unit to provide a measurement voltage to a second input of the amplifier-comparator, the measurement voltage being defined on the basis of a binary word of the logic unit, which defines a digital measurement signal of a preceding measurement cycle or an initial binary word, and wherein the electronic circuit further includes a switching unit for connecting a free end of the second resistor to a polarization voltage whereas a free end of the first resistor is connected to a low voltage or vice versa.

Specific embodiments of the electronic circuit are discussed in further detail below.

One advantage of the electronic interface circuit of a physical sensor lies in the fact that it makes it possible to rapidly obtain at least one measurement signal at the logic unit output, since the resistive sensor is successively polarized in a positive polarization followed by a negative polarization. The logic unit is capable of implementing a stored self-adaptive algorithm to adapt the size of the adaptation steps of the measurement cycles to provide digital signals adapted as a result of detection of a large change in the physical parameter measured during a measurement conversion. Two digital signals depending on a positive polarization or first polarization, and on a negative polarization or second polarization of the fixed electrodes of the pair of capacitors are generally provided in the logic unit. By combining the digital signals this enables any voltage offset to be removed from the electronic circuit components.

BRIEF DESCRIPTION OF THE DRAWINGS

The objects, advantages and features of the method for measuring a physical parameter and the electronic resistive sensor circuit for implementation of the same will appear more clearly in the following description with reference to the drawings, in which.

DETAILED DESCRIPTION OF THE INVENTION

In the following description, since various components of the electronic resistive sensor circuit are well known in this technical field, they will not all be explained in detail. Emphasis is mainly placed on the method for measuring a physical parameter by an electronic circuit which outputs one or more digital measurements signals.

Figure 1:
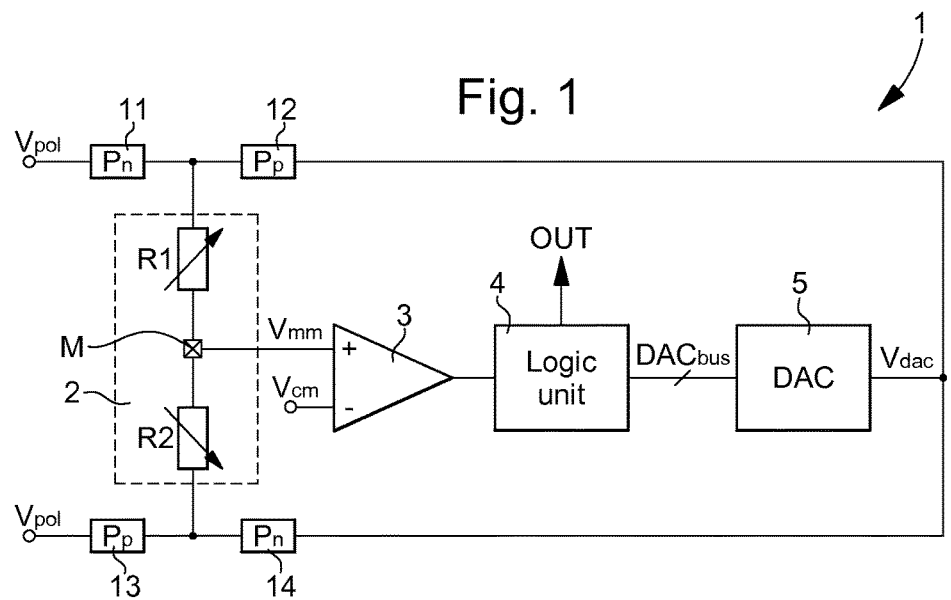
FIG. 1 shows a simplified view of a first embodiment of an electronic resistive sensor circuit for implementation of the physical parameter measurement method according to the invention.

FIG. 1 shows a simplified diagram of a first embodiment of the electronic resistive sensor circuit 2 for a physical parameter measurement, such as an acceleration or an angular velocity, or even a pressure or a force in at least one direction. Resistive sensor 2 is composed of a resistive divider with two resistors R1 and R2 which are series connected. As explained below, each resistor R1 and R2 is a strain gauge whose resistance value varies according to the motion of a moving mass M in a fixed structure of the resistive MEMS sensor. Moving mass M is disposed at the connection node of resistors R1, R2, and moves as a function of the acceleration or of the angular velocity to be measured.

A connection node of resistors R1, R2 is connected to a first input of an amplifier-comparator 3, which forms part of an electronic interface connected to resistive MEMS sensor 2. The first input of the amplifier-comparator is preferably the positive input, whereas a second input, which is preferably the negative input, receives a reference voltage, which is a defined common mode voltage $V_{cm}$. This common mode voltage is preferably set at a value corresponding to half the regulated supply voltage $V_{REG}$ of electronic circuit 1, namely at $V_{REG}/2$. A comparison is made between common mode voltage $V_{cm}$ and voltage $V_{mm}$ at the connection node of the resistors to provide a signal, which is preferably a comparison signal at the amplifier-comparator output, to a logic unit 4.

Logic unit 4 includes storage means, in which are stored, in particular, various configuration parameters, and mainly the measurement algorithm of the method of the invention explained below. Different algorithms may be selected to perform the physical parameter measurement method by changing the logic part of the logic unit 4. Preferably, it is chosen to use a self-adaptive algorithm as explained below. Logic unit 4 also includes a processor (not shown), which is clocked by a conventional clock signal. The processor makes it possible to control execution of all the necessary steps of the method for measuring a physical parameter, particularly an acceleration or an angular velocity.

As a function of the comparison voltage comp_out provided by amplifier-comparator 3, processing is performed in logic unit 4 to store digital signals in the form of binary measurement words in at least two registers. The amplifier-comparator output signal can be considered as a digital signal for operating an increment or decrement of one or more steps in logic unit 4 to generate the digital measurement signals. The digital signals stored in the two registers are obtained following a defined positive polarization and a defined negative polarization of resistive sensor 2 in each measurement cycle as explained below. A first register stores the digital signals following a positive polarization, whereas a second register stores the digital signal following a negative polarization. A combination of the digital signals of the two registers may be performed in said logic unit 4 to provide at least one digital output signal OUT at the end of a measurement conversion after a certain number of measurement cycles.

Each digital measurement signal or binary word $DAC_{bus}$ stored in the two registers of logic unit 4 is successively provided in each measurement cycle phase to digital-to-analogue converter DAC 5. This digital-to-analogue converter 5 makes it possible to convert each binary word $DAC_{bus}$ into a measurement or output voltage $V_{dac}$ to be provided in feedback to resistive sensor 2 via a switching unit. A measurement or output voltage $V_{dacp}$ is provided following a positive polarization of resistive sensor 2 and a measurement or output voltage $V_{dacn}$ is supplied following a negative polarization.

This switching unit includes four switches 11, 12, 13, 14 which may be formed of conventional MOS transistors each controlled across the gate by a respective control signal. The first switch 11 is disposed between a polarization voltage source $V_{pol}$ and a free end of first resistor R1. Second switch 12 is disposed between the output of digital-to-analogue converter 5 and the free end of first resistor R1. The third switch 13 is disposed between the polarization voltage source $V_{pol}$ and a free end of second resistor R2. Finally, the fourth switch 14 is disposed between the output of digital-to-analogue converter 5 and the free end of second resistor R2.

As will be explained in more detail below, the physical parameter measurement method includes, for one measurement cycle, a first polarization phase of resistive sensor 2, followed by a second polarization phase of resistive sensor 2. Only two phases are necessary per measurement cycle with resistive sensor 2. This reduces the time required to provide a measurement compared to a measurement method using a capacitive sensor circuit, where two additional capacitor discharge phases have to be added, making a total of four phases per measurement cycle. The first polarization phase is a phase defined as a positive polarization, whereas the second polarization phase is a phase defined as a negative polarization. Of course, for each measurement cycle, it is possible to envisage starting with a negative polarization phase prior to a positive polarization phase.

In the first positive polarization phase, the second switch 12 and the third switch 13 are respectively controlled by a first control signal $P_p$ to be in a closed state, whereas the first switch 11 and fourth switch 14 are in an open state. Thus the free end of first resistor R1 is connected to the output of digital-to-analogue converter 5 which provides an output voltage $V_{dac}$ from the positive polarization ($V_{dacp}$), and the free end of second resistor R2 is connected to the polarization voltage source $V_{pol}$.

In a second negative polarization phase first switch 11 and second switch 14 are respectively controlled by a second control signal $P_n$ to be in a closed state, whereas the second switch 12 and third switch 13 are in an open state. Thus, the free end of second resistor R2 is connected to the output of digital-to-analogue converter 5 which provides an output voltage $V_{dac}$ from the negative polarization ($V_{dacn}$), and the free end of first resistor R1 is connected to the polarization voltage source $V_{pol}$.

In the first positive polarization phase $P_p$, the converter output voltage following positive polarization $V_{dacp}$ is applied to the free end of first resistor R1. This output voltage $V_{dacp}$ is equal to $V_{cm}+\alpha \cdot V_{REG}+dacp \cdot dac\_step$, where the value of $V_{cm}$ is half the regulated voltage $V_{REG}$, $\alpha$ is a voltage adaptation factor, dcap is derived from the binary word $DAC_{bus}$ of the first register of logic unit 4, and dac_step is a step value expressed in Volt/code. The voltage applied to the free end of second resistor R2 is polarization voltage $V_{pol}$, which may be equal to $V_{REG}/2\pm\alpha \cdot V_{REG}$. Thus, voltage $V_{mm}$ at the connection node of resistors R1 and R2 and provided to the first input of amplifier-comparator 3 is equal to $V_{pol} \cdot (R1/(R1+R2))+V_{dacp} \cdot (R2/(R1+R2))$.

If voltage $V_{mm}$ is greater than $V_{cm}$, then the output signal comp_out of amplifier-comparator 3 is in the "1" state, for example close to regulated voltage $V_{REG}$. The binary word dcap of the first register can be reduced by a certain number of steps. However, if voltage $V_{mm}$ is smaller than $V_{cm}$, than the output signal comp_out of amplifier-comparator 3 is at the "0" state. In that case, binary word dacp of the first register may can increased by a certain number of steps.

In the second negative polarization phase $P_n$, the converter output voltage following negative polarization $V_{dacn}$ is applied to the free end of second resistor R2. This output voltage $V_{dacn}$ is equal to $V_{cm}+\alpha \cdot V_{REG}+dacn \cdot dac\_step$, where the value of $V_{cm}$ is half the regulated voltage $V_{REG}$, $\alpha$ is a voltage adaptation factor, dacn is derived from the binary word $DAC_{bus}$ of the second register of logic unit 4, and dac_step is a step value expressed in Volt/code. The voltage applied to the free end of first resistor R1 is polarization voltage $V_{pol}$, which may be equal to $V_{REG}/2\pm\alpha \cdot V_{REG}$. Thus voltage $V_{mm}$ at the connection node of resistors R1 and R2 and provided to the first input of amplifier-comparator 3 is equal to $V_{pol} \cdot (R2/(R1+R2))+V_{dacn} \cdot (R1/(R1+R2))$.

If voltage $V_{mm}$ is greater than $V_{cm}$, then the output signal comp_out of amplifier-comparator 3 is in the "1" state, for example close to regulated voltage $V_{REG}$. The binary word dacn of the second register may be reduced by a certain number of steps. However, if voltage $V_{mm}$ is smaller than $V_{cm}$, than the output signal comp_out of amplifier-comparator 3 is at the "0" state. In that case, the binary word dacn of the second register may be increased by a certain number of steps.

As mentioned above, only two phases are necessary per measurement cycle with resistive sensor 12 to reduce the time required to provide a measurement compared to a measurement method with a capacitive sensor circuit. For the physical parameter measurement method according to the invention, each phase may have a duration on the order of 2 μs, and thus of 4 μs per measurement cycle. Approximately 40 measurement cycles are required for one measurement conversion, which therefore has a duration on the order of 160 μs. At the end of the conversion, voltage $V_{mm}$ will be close to or equal to voltage $V_{cm}$.

It is also to be noted that, owing to the alternation of positive polarization and negative polarization phases, it is possible to obtain better removal of the offset of electronic circuit 1 and of the low frequency noise. Further, each successive conversion preferably starts with logic unit 4 providing the binary word of the first register and the binary word of the second register from the preceding conversion.

As previously described, resistive MEMS sensor 2 is composed of a resistive divider R1 and R2 or resistive bridge, whose connection node is mechanically connected to mass M. A first free end of first resistor R1 and a second free end of second resistor R2 are mechanically connected in a fixed structure of resistive sensor 2. The first and second resistors R1, R2 are thus strain gauges in the form of metallic wires of nanometric dimensions. These metallic wires are preferably disposed in the fixed structure on the same straight line. The two resistors R1, R2 may have the same resistance value at rest, but a resistance value that varies inversely during measurement of the acceleration or angular velocity, i.e. one resistor is pulled when the other is compressed, and vice versa.

By way of non-limiting example, the metallic wire of each resistor may have a diameter on the order of 250 nm, and a length such that each resistor R1, R2 can have a resistance value at rest on the order of 3 kOhms. A resistance variation of 3 Ohms for 1 g of acceleration may be observed with this construction of resistive sensor 2. With these resistors made with metallic wires of nanometric dimensions, the current flowing through each resistor has to be reduced, i.e. controlled to be less than 100 μA. In such conditions, the polarization voltage $V_{pol}$ provided from the polarization voltage source must be relatively low. This polarization voltage $V_{pol}$ may be equal to $V_{REG}/2 \pm \alpha \cdot V_{REG}$, where $V_{REG}$ is the regulated supply voltage of electronic circuit 1 and a is a voltage adaptation factor. The regulated voltage may be set at 1.65 V. The polarization voltage $V_{pol}$ may be obtained using another resistive divider connected to the regulated voltage or using any other ratiometric structure.

For the physical parameter measurement method using an electronic circuit 1 with a resistive sensor 2 described above, said resistive sensor includes a single resistive divider for one measurement in a single direction. However, it is possible to envisage providing one resistive sensor 2 for two or three measurement axes X, Y and Z with three resistive dividers, wherein preferably the connection nodes of each pair of resistors are connected to the same moving mass M and to the same first input of amplifier-comparator 3.

For a measurement on three axes X, Y and Z, the switching unit must include 3 times four switches respectively controlled by first and second respective control signals for a positive polarization and a negative polarization of each resistive divider of resistive sensor 2. Six registers must also be provided in logic unit 4 to store the digital signals for each axis following the positive polarization and the negative polarization of resistive sensor 2.

For the measurement method, one measurement cycle requires the successive positive polarization of each resistive divider, followed by the successive negative polarization of each resistive divider with the measurements interlaced on the three axes. However, for measurement with this type of resistive sensor 2, it is preferable to perform the entire measurement conversion for a first axis X before starting the measurement conversion for a second axis Y and finally for a third axis Z. This differs from a measurement method using an electronic circuit with a capacitive sensor, in which a capacitor discharge phase must always be provided, which is not necessary for a resistive sensor 2. As mentioned above, a duration on the order of 3 times 160 µs is required for one complete measurement conversion with the three measurement axes of resistive sensor 2.

A self-adaptive algorithm may be implemented, in particular in logic unit 4 of electronic circuit 1 for the physical parameter measurement method, as also described in EP Patent Application No 2 618 163 A1. To achieve this, logic unit 4 may include at least one decision counter connected to the processor, and at least two registers for one measurement axis or six registers for three measurement axes. For a single measurement axis, a first register receives a first digital measurement signal from the defined positive polarization of resistive sensor 2, whereas a second register receives a second digital measurement signal from the defined negative polarization of resistive sensor 2.

During each measurement cycle, the first digital signal and the second digital signal for each axis stored in a corresponding register, are incremented or decremented by a certain numerical value according to a determined programmed step. To achieve this, logic unit 4 includes a multiplication element, which receives output signal comp_out from amplifier-comparator, and a numerical value from an element providing a step value. If the output of amplifier-comparator 3 is at the high state "1", this means that voltage $V_{mm}$ is increasing. In these conditions, the multiplication element multiplies the numerical step value by −1 in order to subtract the numerical step value from the preceding digital signal stored in the corresponding register (dacp, dacn). However, if the output of amplifier-comparator 3 is at the low state "0" this means that voltage $V_{mm}$ is decreasing. In these conditions, the multiplication element multiplies the numerical step value by +1 in order to add the numerical step value to the preceding digital signal stored in the corresponding register.

At the beginning of each conversion, the initial digital signal which results from the positive polarization and the negative polarization, corresponds to the digital signal stored in a corresponding register from a preceding measurement conversion. However, when electronic circuit 1 is actuated, output voltage $V_{dac}$ is preferably at half the regulated voltage, i.e at $V_{reg}/2$ and is based on a first or second initial binary word of logic unit 4. For the first measurement cycles, logic unit 4 is configured to operate the step value supply element so that a small or first step value is added to or subtracted from the digital signal of a corresponding register in each measurement cycle as a function of the output level of amplifier-comparator 3. This small digital step value may advantageously be chosen to be 1 or 2 according to the noise to be taken into account.

After being reset to zero at the start of each measurement conversion, the decision counter counts or counts down according to the state of the output signal from amplifier-comparator 3 in each measurement cycle. If there is only a continual increase or continual decrease of the counter in each successive first measurement cycle of the conversion, logic unit 4 operates the element to adapt the numerical value of each step to a larger step value or second step value. This adaptation occurs as soon as the number of "1"s or "0"s counted in succession exceeds a predetermined threshold, for example after 8, 16, 32 or another number of successive measuring cycles. For example, if after 8 successive measuring cycles, there is only a continual increase or a continual decrease of the counter, the value of each step to be added to or subtracted from a preceding digital signal of a corresponding register is increased. This large or second step value may preferably be programmed at a value equal to 8, but may also be set at another value, such as 16, 32, 64 or another large value on a scale from 0 to 1023 for each 10-bit binary word. This large step value may also be variable, in particular gradually variable above the value of 2 or from one conversion to another. Each binary word may be in more than 10 bits or fewer bits according to the intended application of the electronic resistive sensor circuit 2.

Once the step value has been adapted to a large value, this large step value is added to or subtracted from a preceding digital signal of the first or second register in each successive measurement cycle. As soon as a change in counter sign is detected in these successive measurement cycles having a large step value, the step value is again adapted to a small value by logic unit 4 until the end of the measurement conversion. This is done for the 2 registers in succession, or the 6 registers for a measurement on three axes. Thus the step value to be added or subtracted is self-adapted to take account of a large change in the physical parameter, such as an acceleration, from one conversion to the next conversion, or within the same measurement conversion.

If there is a large acceleration change within the same conversion, it may be necessary to adapt the step value in part of the final measuring cycles of said conversion. This means that re-adaptation to a small value cannot occur in the conversion and only the final value of each digital signal is taken into account for a subsequent conversion.

For each measurement conversion, in which 16, 32, 40 or 64 successive measuring cycles can be provided, it is possible to calculate the mean of all the successive digital signals stored in a corresponding register once logic unit 4 has re-adapted the step value to a small value. If no step value adaptation has occurred during the entire measurement conversion, when there are no large changes from one conversion to a subsequent conversion, the mean of most of the last or of all the successive stored digital signals can be calculated. At least 8, 10 or 12 samples may in principle be necessary to calculate the mean in successive measurement cycles in small steps.

The mean of the successive digital signals is calculated via a mean calculation element connected to the registers. Several successive digital signals at the end of the conversion can also be stored in the mean calculation element. This mean is only calculated if no abrupt change occurs in the final measurement conversion phase. In the event of an abrupt change, the step value is again adapted to a larger step value and a continual increase or a continual decrease in each measurement cycle with a large step value may occur until the end of the conversion. In these conditions, only the last digital signal for one or more axes and each polarization is retained in the memory in order to start a new measurement conversion.

Logic unit 4 makes it possible to provide at least one digital output signal OUT at the end of a measurement conversion. In this regard, a combination or addition or subtraction of the two corresponding registers of one axis or of several axes is performed. It may be provided to take the binary word of the first register dacp and the binary word of the second register dacn and to perform the operation dacp-dacn to provide digital output signal OUT. In this combined digital output signal OUT, any voltage offset has been removed.

It is to be noted that at the end of each conversion, either the last digital signal of each register, or the stored mean of various digital signals in at least a final part of the measurement cycles, is used for a new conversion. This advantageously means that advantage can be taken of preceding value variations in previous conversions while storing the preceding offset. In these conditions, adaptation to a large step value is no longer necessarily required for the measurement cycles of a subsequent conversion if there is no significant change in the physical parameter to be measured. Measurement cycles that add or subtract a small step value advantageously make it possible to reduce the effects of noise.

Figure 2:
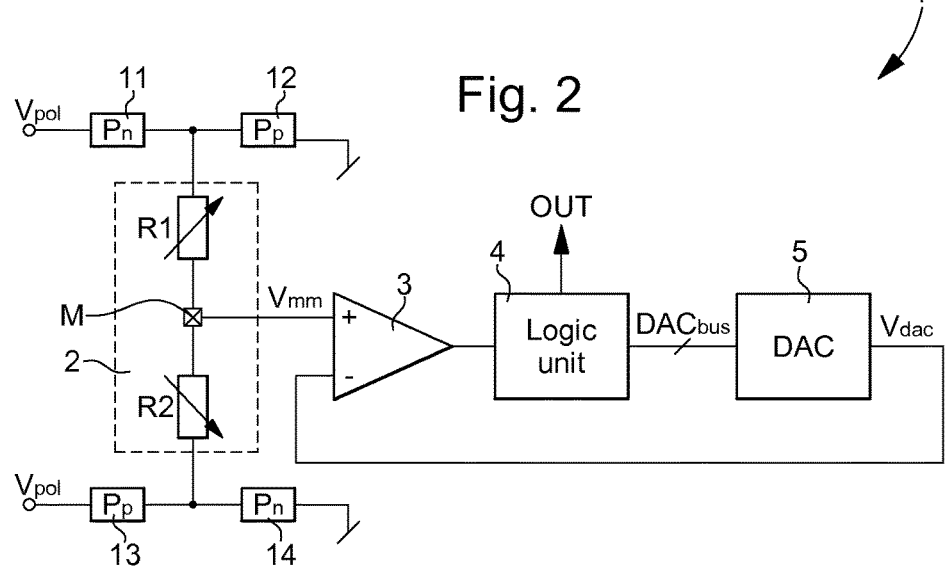
FIG. 2 shows a simplified view of a second embodiment of an electronic resistive sensor circuit for implementation of the physical parameter measurement method according to the invention.

FIG. 2 shows a simplified diagram of a second embodiment of electronic circuit 1 with resistive sensor 2 for measurement of a physical parameter, such as an acceleration or an angular velocity, or a pressure or a force in at least one direction. Given that this second embodiment includes identical elements to those described with reference to FIG. 1, for the sake of simplification, only the differences with respect to the first embodiment will be described.

There is provided for this second embodiment a resistive sensor 2 with a single resistive divider for a measurement on one axis. However, as previously described, it is possible to envisage having a resistive sensor 2 with three resistive dividers for a measurement on three axes.

The main difference of this second embodiment is that the output voltage of digital-to-analogue converter 5 $V_{dac}$ is provided directly to the second input of amplifier-comparator 3, which is preferably the negative input. The first input of amplifier-comparator 3 remains connected to moving mass M and to the connection node of the two resistors R1 and R2 of the resistive divider.

The switching unit still includes the four switches 11, 12, 13, 14 which may be formed of conventional MOS transistors each controlled across the gate by a respective control signal. The first switch 11 is disposed between a polarization voltage source $V_{pol}$ and a free end of first resistor R1. The second switch 12 is, however, disposed between a low voltage terminal, for example an earth terminal, and the free end of the first resistor R1. The third switch 13 is disposed between the polarization voltage source $V_{pol}$ and a free end of second resistor R2. Finally, the fourth switch 14 is, however, disposed between a low voltage terminal, for example an earth terminal, and the free end of second resistor R2.

Since the output voltage $V_{dac}$ is provided directly to the second input of amplifier-comparator 3, there is a slight difference in adaptation of the digital signals following the positive polarization and the negative polarization in logic unit 4. If voltage $V_{mm}$ is greater than voltage $V_{dac}$, then the output signal comp_out of amplifier-comparator 3 is at the "1" state, for example close to regulated voltage $V_{REG}$. The binary word dacp of the first register or the binary word dacn of the second register may be increased by a certain number of steps. However, if voltage $V_{mm}$ is smaller than $V_{cm}$, then the output signal comp_out of the amplifier-comparator 3 is at the "0" state. In such case, the binary word dacp of the first register or the binary word dacn of the second register may be decreased by a certain number of steps. At the end of the measurement conversion, voltage $V_{mm}$ will correspond to voltage $V_{dac}$.

It is to be noted that, for this second embodiment of electronic circuit 1, the same self-adaptive algorithm can be used for the physical parameter measurement method in logic unit 4.

Figure 3:
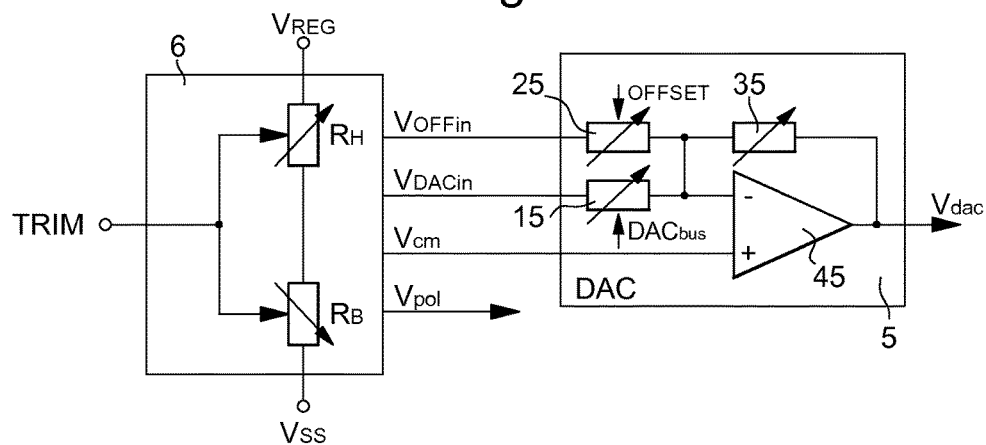
FIG. 3 shows an embodiment of the digital-to-analogue converter DAC with a programmable gain reference voltage generator unit of the electronic circuit according to the invention.

FIG. 3 shows the digital-to-analogue converter DAC 5 connected to a programmable gain reference voltage generator 6 for the first and second embodiments of electronic circuit 1. Logic unit 4 also provides digital-to-analogue converter 5 with a binary adjustment word OFFSET (10 bits) for an offset voltage relating to resistive MEMS sensor 2. This digital-to-analogue converter 5 connected to a programmable gain reference voltage generator 6 is also described in detail in paragraphs 48 and 49 in EP Patent Application No 2 618 163 A1, which is incorporated herein by reference.

Programmable gain reference voltage generator 6 includes resistive dividers $R_H$, $R_B$ disposed in series between regulated voltage $V_{REG}$ and low voltage $V_{SS}$, which is earth, to provide common mode voltage $V_{cm}$ and polarization voltage $V_{pol}$. These resistive dividers are programmable, notably by a binary word TRIM, to adjust the various voltage levels to be provided from the programmable gain reference voltage generator 6.

A reference voltage $V_{DACin}$, which is from programmable gain reference voltage generator 6, is provided to a first end of a first resistive divider 15 of digital-to-analogue converter 5. This first resistive divider 15 can be programmed by the binary word $DAC_{bus}$ from the first register or second register of logic unit 4. A second end of first resistive divider 15 is connected to a first input of an amplifier 45 of converter 5. The first input of amplifier 45 may be the negative input.

An adjustment voltage $V_{oFFin}$, which is from programmable gain reference voltage generator 6, is provided to a first end of a second resistive divider 25 of digital-to-analogue converter 5. This second resistive divider 25 can be programmed by binary adjustment word OFFSET from logic unit 4. A second end of the second resistive divider 25 is also connected to the first input of amplifier 45 of converter 5.

A second input of amplifier 45 of converter 5 receives a reference voltage, corresponding to the common mode voltage $V_{cm}$ of programmable gain reference voltage generator 6. This second input of amplifier 45 may be the positive input. A programmable resistor 35 is also connected between the first input of amplifier 45 and an amplifier output, which provides output voltage $V_{dac}$.

From the description that has just been given, multiple variants of the physical parameter measurement method and the electronic resistive sensor circuit for implementation of the same can be devised by those skilled in the art without departing from the scope of the invention defined by the claims. It is possible to envisage altering the duration of each phase in relation to the other, or the duration of each cycle during the physical parameter measurement operations, as well as the number of successive measurement cycles for each measurement conversion. The large step value in the measurement cycles can be increased or decreased gradually within the same conversion, or modified from one conversion to a subsequent conversion. The order of the positive and negative polarizations can be altered in each measurement cycle. Each resistor of the resistive sensor may be a set of individual resistors to match the two resistors of the resistive divider.

What is claimed is:

1. A method for measuring a physical parameter by means of an electronic circuit with a resistive sensor, which includes a resistive divider with at least two resistors mounted in series, wherein a connection node of the two resistors is connected to a moving mass, which is elastically retained in a fixed structure of the sensor, and to a first input of an amplifier-comparator, a second input of the amplifier-comparator receiving a reference voltage, one output of the amplifier-comparator being connected to a logic unit for digital processing of the information provided by the amplifier-comparator and for providing at least one digital output signal, and a digital-to-analogue converter capable of providing a measurement voltage to a free end of the first resistor or to a free end of the second resistor via a switching unit, the measurement voltage being defined on the basis of a conversion of a binary word of the logic unit, which defines at least one measurement signal, wherein the method includes several successive measurement cycles for one measurement conversion, wherein each successive measurement cycle comprises the steps of:
  a) polarizing, via the switching unit, the free end of the second resistor by a polarization voltage and the free end of the first resistor by a measurement voltage provided by the digital-to-analogue converter based on a first digital measurement signal from a preceding cycle or from an initial binary word provided by the logic unit, the first digital signal depending on a first polarization of the resistive sensor,
  b) polarizing, via the switching unit, the free end of the first resistor by a polarization voltage and the free end of the second resistor by a measurement voltage provided by the digital-to-analogue converter based on a second digital measurement signal from a preceding cycle or from an initial binary word provided by the logic unit, the second digital signal depending on a second polarization of the resistive sensor.

2. The measurement method according to claim 1, wherein the logic unit includes a first register for storing the first digital measurement signal following a first polarization, defined as a positive polarization, and a second register for storing the second digital measurement signal following a second polarization, defined as a negative polarization, wherein each measurement conversion starts on the basis of a final numerical value of each digital signal stored in the first register and the second register from a preceding conversion or on the basis of an initial binary word corresponding, after conversion by the converter, to half of a regulated supply voltage of the electronic circuit.

3. The measurement method according to claim 1, wherein the resistive sensor includes three resistive dividers each composed of at least two resistors mounted in series, and arranged to measure a physical parameter in three directions or on three axes X, Y, Z, the two resistors of each divider having a common connection node connected to a common moving mass and to the same first input of the amplifier-comparator, wherein the method includes six successive phases per measurement cycle, which consist in successively repeating, during the first three phases, step a) for each axis X, Y, Z with a first digital signal corresponding to the selected axis, and in successively repeating, during the last three phases, step b) for each axis X, Y, Z with a second digital signal corresponding to the selected axis.

4. The measurement method according to claim 1, wherein the resistive sensor includes three resistive dividers each composed of at least two resistors mounted in series, and arranged to measure a physical parameter in three directions or on three axes X, Y, Z, the two resistors of each divider having a common connection node connected to a common moving mass and to the same first input of the amplifier-comparator, wherein the method includes three successive measurement conversions on the three measurement axes to represent one complete measurement conversion, wherein each measurement conversion includes a certain number of measurement cycles successively composed of steps a) and b) with a first digital measurement signal and a second digital measurement signal stored in the logic unit and for each corresponding measurement axis.

5. The measurement method according to claim 1, wherein the method uses a self-adaptive algorithm, wherein each measurement conversion starts with measurement cycles, wherein the first and second digital signals for each axis are adapted in the logic unit, by the addition or the subtraction of a first step value equal to 1 or 2 as a function of the state of the output signal of the amplifier-comparator in each measurement cycle, wherein a decision counter of the logic unit counts or counts down the successive output states of the amplifier-comparator in each measurement cycle, so as to adapt the first and second digital signals of each axis by the addition or the subtraction of a second determined step value higher than 2, if the number of identical output states of the amplifier-comparator successively counted or counted down exceeds a predetermined threshold, and wherein detection of a change of sign in the count or countdown of the decision counter in the measurement cycles at the second step value, is checked in the logic unit so as to re-adapt the step size to the first step value in the event of a change of sign, until the end of the measurement conversion.

6. The measurement method according to claim 5, wherein 16, 32, 40 or 64 measurement cycles are performed in each measurement conversion, wherein the first step value is equal to 1 and wherein the second step value is greater than or equal to 8.

7. An electronic circuit with a resistive sensor for implementation of a method for measuring a physical parameter by means of an electronic circuit with a resistive sensor, which includes a resistive divider with at least two resistors mounted in series, wherein a connection node of the two resistors is connected to a moving mass, which is elastically retained in a fixed structure of the sensor, and to a first input of an amplifier-comparator, a second input of the amplifier-comparator receiving a reference voltage, one output of the amplifier-comparator being connected to a logic unit for digital processing of the information provided by the amplifier-comparator and for providing at least one digital output signal, and a digital-to-analogue converter capable of providing a measurement voltage to a free end of the first resistor or to a free end of the second resistor via a switching unit, the measurement voltage being defined on the basis of a conversion of a binary word of the look unit, which defines at least one measurement signal, wherein the method includes several successive measurement cycles for one measurement conversion, wherein each successive measurement cycle comprises the stems of:

a) polarizing, via the switching unit, the free end of the second resistor by a polarization voltage and the free end of the first resistor by a measurement voltage provided by the digital-to-analogue converter based on a first digital measurement signal from a preceding cycle or from an initial binary word provided by the logic unit, the first digital signal depending on a first polarization of the resistive sensor, b) polarizing, via the switching unit, the free end of the first resistor by a polarization voltage and the free end of the second resistor by a measurement voltage provided by the digital-to-analogue converter based on a second digital measurement signal from a preceding cycle or from an initial binary word provided by the logic unit, the second digital signal depending on a second polarization of the resistive sensor, the resistive sensor including a resistive divider with at least a first resistor and a second resistor mounted in series, wherein a connection node of the two resistors is connected to a moving mass, which is elastically retained in a fixed structure of the sensor, and to a first input of an amplifier-comparator, a second input of the amplifier-comparator receiving a reference voltage, wherein one output of the amplifier-comparator is connected to a logic unit for digital processing of the information provided by the amplifier-comparator and for providing at least one digital output signal, and wherein the electronic circuit further includes a digital-to-analogue converter capable of providing a measurement voltage to a free end of the first resistor, whereas a free end of the second resistor is polarized by a polarization voltage, or of providing the measurement voltage to the free end of the second resistor, whereas the free end of the first resistor is polarized by the polarization voltage, via a switching unit, the measurement voltage being defined on the basis of a conversion of a binary word of the logic unit, which defines at least one measurement signal.

8. The electronic circuit according to claim 7, wherein the logic unit includes two registers for storing the first and second digital measurement signals.

9. The electronic circuit according to claim 8, wherein the resistive sensor includes three resistive dividers each composed of at least a first and a second resistors mounted in series and arranged for measurement of a physical parameter in three directions or on three axes X, Y, Z, the two resistors of each divider having a common connection node connected to a common moving mass and to the same first input of the amplifier-comparator, and wherein the logic unit includes six registers for storing the first and second digital measurement signals of each axis.

10. The electronic circuit according to claim 7, wherein the switching unit includes four switches, which are controlled by a respective control signal, a first switch being disposed between a polarization voltage source and a free end of the first resistor, a second switch being disposed between the output of the analogue-to-digital converter and the free end of the first resistor, a third switch being disposed between the polarization voltage source and a free end of the second resistor and a fourth switch being disposed between the output of the analogue-to-digital converter and the free end of the second resistor.

11. The electronic circuit according to claim 7, wherein the first input of the amplifier-comparator is a positive input, and wherein the second input of the amplifier-comparator is a negative input.

\* \* \* \* \*